US006038617A

United States Patent [19]
Thomson

[11] Patent Number: 6,038,617
[45] Date of Patent: Mar. 14, 2000

[54] AUTO CONFIGURATION OF A SERIAL ROM BY SENSING AN OUTPUT OF THE SERIAL ROM AFTER TRANSMISSION OF A READ INSTRUCTION AND AN X-BIT ADDRESS TO IT'S INPUT

[75] Inventor: Andrew C. Thomson, Austin, Tex.

[73] Assignee: National Instruments Corporation, Austin, Tex.

[21] Appl. No.: 09/027,982

[22] Filed: Feb. 23, 1998

[51] Int. Cl.[7] ...................................................... G06F 13/14
[52] U.S. Cl. ................... 710/8; 365/230.01; 365/230.03; 365/230.08; 711/102
[58] Field of Search ................................. 710/8; 711/102; 365/230.01, 230.02, 230.03, 230.06, 230.08

[56] References Cited

U.S. PATENT DOCUMENTS

| | | | |
|---|---|---|---|
| 5,604,880 | 2/1997 | Dipert | 711/103 |
| 5,715,207 | 2/1998 | Cowell | 365/230.02 |
| 5,751,996 | 5/1998 | Glew et al. | 711/145 |

*Primary Examiner*—Thomas C. Lee
*Assistant Examiner*—Adbelmoniem Elamin
*Attorney, Agent, or Firm*—Conley, Rose & Tayon; Jeffrey C. Hood; Eric A. Stephenson

[57] ABSTRACT

A device for configuring a serial ROM. In accordance thereto, a read instruction is serially transmitted to the input of the serial ROM. Thereafter, an x-bit address of all zeros is serially transmitted to the input of the serial ROM. Each bit of the instruction and x-bit address is transmitted to the input of this serial ROM on a rising edge of a clock also inputted to the serial ROM. The output of the serial ROM is connected to a precharged sense node. Prior to the serial ROM outputting data in response to the x-bit address, the serial ROM will discharge the sense node to ground if the serial ROM is one of the first type of serial ROMs. However, if the serial ROM is a second type, the sensing node will not be discharged to ground prior to output of the data. Immediately after transmission of the x-bit address, a configuration register is set to indicate the type of serial ROM. In this regard, the configuration register is set according to whether the sense node is discharged or not upon complete transmission of the x-bit address.

14 Claims, 4 Drawing Sheets

AUTO CONFIGURATION OF A SERIAL ROM BY SENSING AN OUTPUT OF THE SERIAL ROM AFTER TRANSMISSION OF A READ INSTRUCTION AND AN X-BIT ADDRESS TO IT'S INPUT

BACKGROUND OF THE INVENTION

1. Field of the Invention

The present invention generally relates to the art of integrated circuits, and more particularly, to a circuit and method for configuring a memory device.

2. Description of the Relevant Art

Typical ISA bus systems contain several cards, each one of which receives broadcast CPU access requests. Each card, however, differentiates among the access requests to identify those it should respond to. This is facilitated by each card, for example, knowing what ISA memory space is allocated to it. Prior to ISA Plug and Play protocol, a standard well known in the industry, ISA resources, e.g., ISA memory space, were allocated to the connected cards by the system user. To this end, analysis was required to determine the amount of memory space available in the ISA system, how much memory is required by, for example, a newly coupled card, and setting the new card to utilize a range of available memory space.

ISA Plug and Play was implemented to allow the operating system to configure the cards. In general, the operating system identifies the ISA cards connected thereto, queries each card to determine the resources including the amount of memory space it needs, and allocates the available ISA resources accordingly. The CPU initiates its sequence by isolating each card one at a time. Each ISA card has a unique identifier defined by a code, portions of which are indicative of card manufacturer, card model, and card serial number. As can be seen, no two cards can have the same identifier since each card model manufactured by a company will have a different serial number. During isolation, all the card IDs are accessed to determine which has the lowest serial number. The isolated card is queried for its ISA resource requirements, i.e., its configuration information. The card with the lowest serial number is directed to receive the immediate configuration instructions from the CPU. The other cards, will ignore the immediate configuration commands. Once one of the cards is isolated and configured, the operating system identifies the next card with the lowest serial identification and queries the configuration information stored therein, which is subsequently used by the CPU to allocate ISA resources accordingly.

The card identifier and the configuration information are typically stored in a serial read only memory (ROM) within each card. Serial ROMs are the preferred device to store the configuration information since they are capable of being programmed with individual identification codes along with common configuration information. Further, serial ROMs can be programmed after the individual cards are assembled.

The 93x6 family of serial ROMs is a popular, low-cost ROM for storing such configuration information. Different versions of the 93x6 ROM contain differing amounts of memory. Moreover, the 93x6 ROMs have similar but not identical protocols for accessing information stored therein.

Shown in FIG. 1 is a typical 93x6 ROM 10 generally available on the market. The ROM includes a memory array 12 in data communication with data register 14, mode decode logic circuit 16, internal clock and generation circuit 20, address decoder 22, address counter 24, and output buffer 26. Data register 14 stores data to be written to or read from memory array 12 at an address specified in address decoder 22.

Configuration data is read from the ROM 10 using four digital signals: chip select (CS), clock (CLK), data in (DI), and data out (DO). When CS is high, ROM 10 is selected or enabled. A low level on CS deselects or disables ROM 10 and forces it into standby mode. CLK is used to synchronize the communication between a master device and ROM 10. Opcode and address, bits are clocked serially into DI on the positive edge of CLK. Data bytes are clocked out serially from DO on the positive edge of CLK, one bit at a time in response to the ROM 10 receiving the read instruction and address.

ROM 10 ignores CLK if CS is low. If CS is high, but a start condition has not been detected, any number of clock signals can be received by ROM 10 without changing its status. After detection of a start condition, a specified number of clock signals (respectively low to high transitions of CLK) must be provided to access ROM 10 as will be more fully described below. In a read operation these clock cycles are required to clock in the read instruction and the address to be read, one bit at a time.

DI is used to clock in a start bit, read instruction opcode, and address bits synchronously with the CLK input. DO is used in the read mode to output data synchronously with the CLK input. The start bit is detected by the device if CS and DI are both high with respect to the positive edge of CLK. Any read instruction following a start condition will be executed if the required amount of opcode and address bits for any particular instruction is clocked in. After the read instruction is executed, CLK and DI are ignored until a new start condition is detected.

The read instruction outputs serial data of the addressed memory location at DO. A dummy zero bit precedes each word read from the addressed memory. Output data bits will toggle on the rising edge of CLK and are stable after a specified time delay. A sequential read is possible when CS is held high. The memory will automatically cycle to the next register and output sequentially. DO is normally tristated except when reading data from the device.

As noted above, there are several different types of ROMs 10. The main differences between them are in memory size and addressing protocol. ROM 10 implemented as a 9346 type device has 1024 bits (128 bytes) of memory. ROM 10 implemented as a 9356 has 2048 (256 bytes) of memory. The 9356 requires 9 address bits to access a given memory location while the 9346 requires only 7 bits. Since the 9356 and 9346 require a different number of address bits in a read operation, the protocols for accessing the 9356 and 9346 are required to be different.

The required input to DI to read a word from a 9346 type ROM is shown in FIG. 2. Specifically, at time $t_1$, CS is asserted high and the 9346 tristates DO. Thereafter, the start bit is sent by driving DI high followed by a low to high transition at CLK as seen at time $t_2$. The read opcode is sent by clocking a high into DI at $t_3$ followed by a low clocked into DI at $t_4$. Thereafter, seven address bits are clocked into DI at $t_5$–$t_{12}$. In response to the last address bit being clocked in, the 9346 drives DO low at $t_{13}$. From $t_{14}$–$t_{22}$, the 9346 drives one bit of the word selected on DO at each clock edge.

The sequence used for reading a word from the 9356 type of device is similar to that for the 9346 device. However, the 9356 device requires two more address bits to be sequentially clocked into DI. The 9356 ROM like the 9346 ROM drives DO low in response to the last address bit being clocked into DI.

As noted, above, the ISA Plug and Play protocol is an industry standard that allows a personal computer to dynamically allocate system resources to ISA cards. Part of this protocol requires that card configuration data be sent to an ISA bus master. The configuration data is typically stored in the serial ROM described above. The Plug and Play protocol dictates that the configuration data be read from the ROM at certain times.

The configuration information stored in the ROM is typically unique for each ISA card manufactured. Moreover, one card may require more configuration information than other cards. The 9346 and 9356 ROMs can accommodate the differing amount of configuration information required to be stored. It is useful for a single integrated circuit which implements the ISA Plug and Play protocol, to be able to access either the 9346 or 9356 type ROMs to retrieve the configuration information. In other words, the Plug and Play implementing chip should be flexible enough to operate in connection with either the 9346 or 9356 style ROMs. Accordingly, there is a need to develop an integrated circuit that implements the ISA Plug and Play protocol which is able to automatically detect which communication protocol is necessary for accessing an unknown type of serial ROM used to store configuration information.

SUMMARY OF THE INVENTION

The present invention solves the aforementioned problems and others and provides a method and apparatus for configuring a memory device. In accordance with the present invention, a read instruction is transmitted to the memory device followed by an x-bit address. The memory device, in response, generates a signal at its output indicative of the memory device type. Thereafter, the configuration register is set in accordance with the signal output by the memory device to indicate the type thereof Thereafter, the information stored within the configuration register is accessed so that the appropriate protocol can be selected for accessing information within the memory device.

One advantage of the present invention is that it allows systems to adapt to differing types of memory devices being utilized therein.

Another advantage of the present invention is that it can automatically determine the configuration of a serial ROM without having to access information stored within the serial ROM.

BRIEF DESCRIPTION OF THE DRAWINGS

Other objects and advantages of the present invention will become apparent upon reading the following detailed description and upon reference to the accompanying drawings in which.

Figure 1:
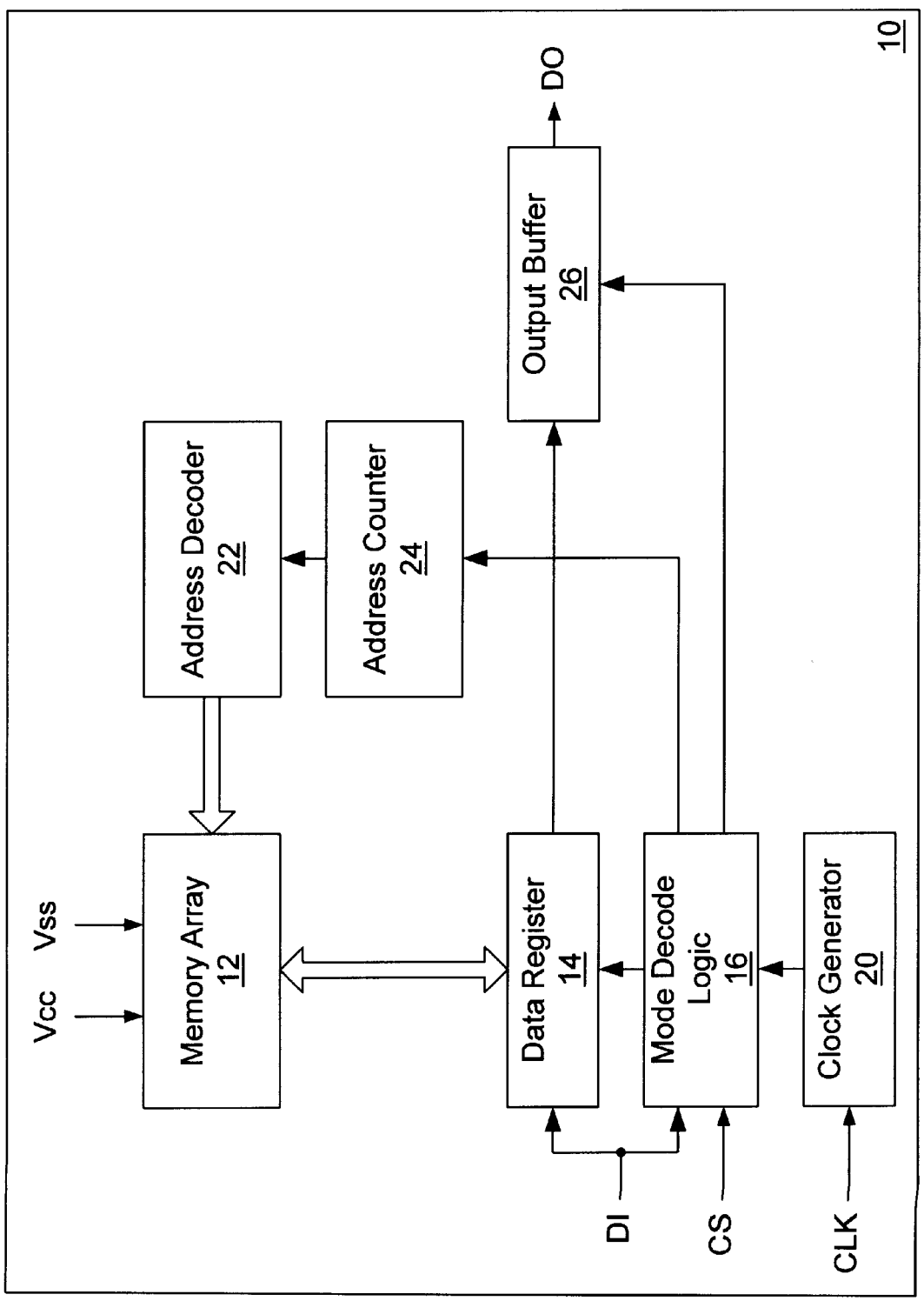
FIG. 1 is a block diagram of a serial ROM employed in the present invention.
Figure 2:
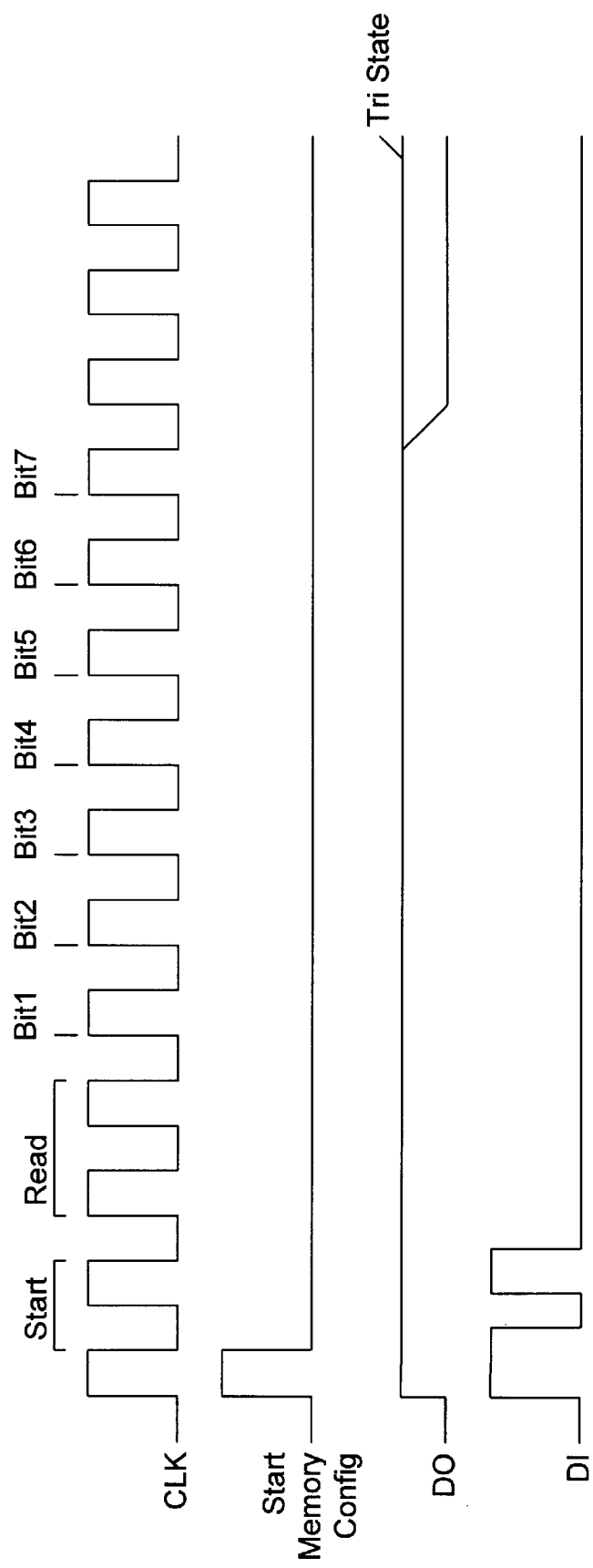
FIG. 2 is a timing chart illustrating operation of the serial ROM of FIG. 1.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 3:
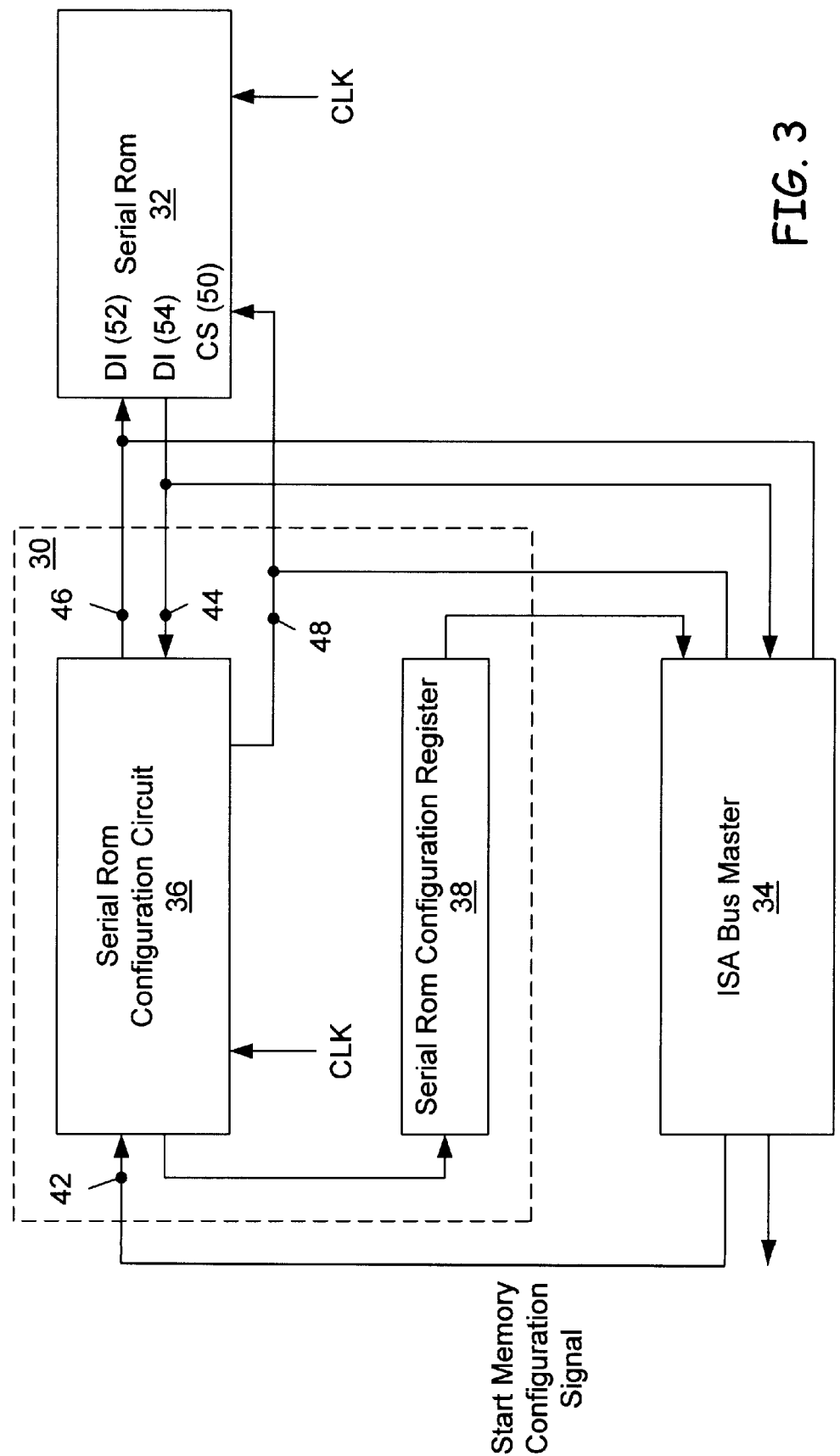
FIG. 3 is a block diagram of a configuration circuit employing the present to invention.

FIG. 3 is a block diagram of a Plug and Play card implementing the present invention and having a memory device configuration circuit 30 coupled to a memory device 32 and an ISA bus interface circuit 34. It is to be understood that the application of the present invention should not be limited to Plug and Play technology. Rather, the present invention could be used to configure memory which data for many types of applications. For example, the present invention could be used to configure memory which stores PCI data.

In one embodiment, the memory device 32 is embodied in a serial ROM such as the 9346 or 9356 type devices described above. However, it is to be understood that memory device 32 may be defined by devices other than 9346 or 9356 type serial ROMs. Further, memory device configuration circuit 30 is defined in FIG. 1 as a serial ROM configuration circuit 36 coupled to a configuration register 38. Again, it is to be understood that memory device configuration circuit 30 may take forms other than that shown in FIG. 3.

Serial ROM configuration circuit 36 includes a first input 42 for receiving a start configuration signal from ISA bus interface circuit 34 a sense node 44 configured to receive output signals from serial ROM 32, a first output node 46 through which the serial configuration circuit 36 transmits read instructions and address signals to serial ROM 32, and a control node 48 through which the configuration circuit 36 passes a chip select or enable signal to serial ROM 32.

As noted above, when systems are built which implement the ISA Plug and Play, the protocol often requires that Plug & Play configuration data, stored in the serial ROM 32, be periodically sent to ISA bus interface circuit 34. ISA bus interface circuit 34 is configured to access a variety of serial ROMs 32 using one of several predetermined communications protocol in order to provide greater system adaptability. However, the ISA bus interface circuit 34 must know in advance which type of serial ROM 32 stores the Plug and Play configuration information in order to select the proper protocol to access ROM 32. Configuration circuit 36 is provided to configure or determine the type of serial ROM 32, and set the configuration register 38 accordingly. Thereafter, ISA bus interface circuit 34 accesses the configuration register and uses the information stored therein to select the appropriate protocol to access Plug and Play configuration information stored within the serial ROM 32.

Figure 4:
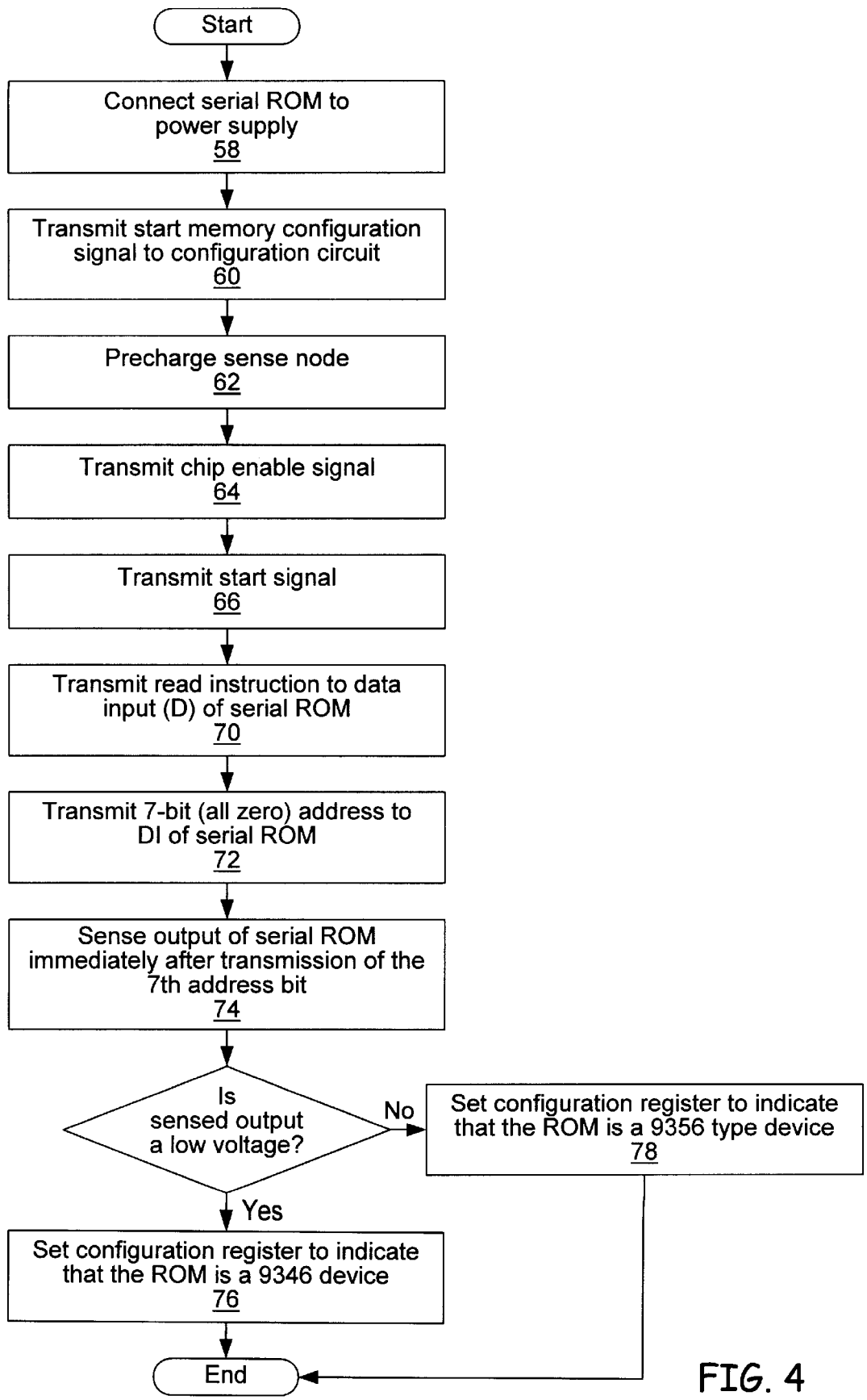
FIG. 4 is a flow chart illustrating the operational aspects of the configuration circuit shown in FIG. 3.

FIG. 4 is a flowchart showing operation aspects of the serial ROM configuration circuit 16. At step 60 serial ROM configuration circuit 36 initiates its configuration sequence in response to receiving a start memory configuration signal from ISA bus interface circuit 34 at first input node 42. Generally, ISA bus interface circuit 34 will issue its start memory configuration signal immediately after power is first provided to the Plug and Play card as shown in step 58. At step 62, ROM configuration circuit precharges sense node 44 to a high voltage substantially equal to the supply voltage in response to receiving the start configuration signal. Upon receipt of the start configuration signal, configuration circuit 36 also issues an enable or chip select signal at step 64 which is transmitted to a chip select input 50 of serial ROM 32.

Thereafter, in step 66, serial ROM configuration circuit 36 issues a start signal which is transmitted to data input (DI) 52 of serial ROM 12 via the first output node 46. The start signal warns the serial ROM 12 that an instruction is to follow on the next rising clock edge. In step 70, the configuration circuit 16 issues a read instruction which is transmitted to DI 52 via first output 46. At step 72 the serial ROM configuration circuit 16 issues a 7-bit address, all zeros, which is transmitted to DI 52. The 7-bit all zeros address accesses the first memory location within serial ROM 32. Each zero of the 7-bit address is transmitted on a rising edge of the clock input to the configuration circuit 36 and serial ROM 32. At step 74, serial ROM configuration circuit 36 senses the voltage at sense node 44 immediately after transmission of the last zero bit of the 7-bit address signal. If the serial ROM 32 is, for example, a 9346 class device, then the serial ROM 32 will discharge sense node 44. If the serial ROM 32 is other than a 9346 class device, the serial ROM 32 will not discharge at sense node 24.

At step 76 or 78, a serial ROM configuration circuit 36 senses the voltage at sense node 44 and sets the configuration register 38 accordingly. Namely, if the sense node is discharged to ground, serial ROM configuration circuit 36 sets serial ROM configuration register 38 by storing therein a value indicating that ROM 32 is a 9346 type device. If the voltage at sense node 44 remains high, serial ROM configuration circuit 36 will set serial ROM configuration register 38 to indicate that the serial ROM is a 9356 type device. At step 80, the configuration sequence ends. Thereafter, ISA bus interface circuit 34 accesses configuration register 38 to identify the type of serial ROM in order to select the appropriate communications protocol for accessing the Plug and Play configuration information stored therein.

Once the configuration register 38 is set, ISA bus interface circuit 34 begins communicating with serial ROM 32 via DI 52, DO 54, and chip select input 50.

The serial configuration circuit 36 includes a sense node precharging circuit (not shown) defined by N channel field effect transistor coupled between a supply voltage and sense 44. The precharging circuit operates to conduct current to sense node 24 in response to receiving the start memory configuration signal at its gate. The current conducted through the precharge circuit charges sense node 44 to a predetermined voltage substantially equal to the supply voltage.

Serial ROM configuration circuit 36 further includes a sensing circuit (not shown) having an input coupled to sense node 44 and an output configured to invert the signal present at the input. Serial ROM configuration circuit 36 stores the output of the sensing circuit into serial ROM configuration register 38 after transmission of the 7-bit zero address signal. Thus, if sense node 44 is discharged to ground after transmission of the 7-bit all zero address signal, the sensing circuit will output a high voltage which in turn is stored into serial ROM configuration register 38 thereby indicating the memory device to be a 9346type device. In contrast, if sense node 44 is not discharged to ground but rather maintains its precharged value, the sensing circuit will generate a low voltage which in turn is stored in serial ROM configuration register 38 thereby indicating that the memory device is a 9356 type ROM.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the following claims.

What is claimed is:

1. A method of configuring a memory device comprising the steps:

precharging a sense node coupled to the memory device;

transmitting a read instruction to an input of the memory device;

transmitting an x-bit address to the input of the memory device after transmitting the read instruction;

sensing an output of the memory device by sensing the voltage at the sense node after transmission of the read instruction and the x-bit address;

setting a configuration register to indicate the memory device is a first type of memory device when a first signal is sensed at the output; and setting the configuration register to indicate the memory device is a second type of memory device when a second signal is sensed at the output.

2. The method of claim 1 wherein the x-bit address is transmitted serially to the memory device input, and wherein the memory device is configured to serially output data.

3. The method of claim 1 wherein the output of the memory device is sensed before the memory device outputs data in response to receiving the read instruction and x-bit address.

4. A method of configuring a memory device comprising the steps:

connecting the memory device to a power supply;

precharging a sense node coupled to the memory device;

transmitting a read instruction to an input of the memory device after connecting the memory device to the power supply;

transmitting an x-bit address to the input of the memory device after transmitting the read instruction;

sensing one of first and second output signals at the sense node generated by the memory device, wherein one of the first and second signals is generated in response to the memory device receiving the read instruction and the x-bit address;

setting a configuration register to indicate that the memory device is a first type of memory device in response to sensing the first output signal;

setting the configuration register to indicate that the memory device is a second type of memory device in response to sensing the second output signal.

5. The method of claim 4 further comprising the step of inputting a clock to the memory device wherein each bit of the x-bit address is input serially to the memory device with a rising edge of the clock, and wherein the memory device generates one of the first or second output signals with a first rising clock edge after transmission of an $X^{th}$ bit of the x-bit address.

6. The method of claim 4 further comprising the step of the memory device outputting data stored at the x-bit address after sensing as of its first and second output signals.

7. The method of claim 4 wherein the memory device serially outputs data in response to receiving the read instruction and the x-bit address.

8. The method of claim 4, wherein the sense node is coupled to the memory device output prior to sensing one of the first and second output signals.

9. An integrated circuit comprising:

a memory configuration circuit for determining read or write configuration of a memory device;

a configuration register coupled to the memory configuration circuit, for storing information indicating the memory device's configuration;

wherein said memory configuration circuit comprises:

a first input for receiving a start configuration signal;

a first output configured to serially transmit a read instruction and an x-bit address signal to a data input of the memory device in response to the first input receiving the start configuration signal;

a sensing node configured to sense an output of the memory device in response to the first output transmitting the read instruction and the x-bit address;

a second output coupled to the configuration register, for setting the configuration register according to the memory device output sensed at the sensing node; and a precharge transistor coupled to the sensing node, wherein the precharge transistor is configured to precharge the sensing node to a first voltage level in response to the input node receiving the start configuration signal; and an inverter having an input coupled to the sensing node, for generating an inversion of a voltage on the sensing node.

10. A system for detecting presence of either a first type of memory device or a second type of memory device comprising:

a memory device, wherein the memory device is one of a first type of memory device or a second type of memory device;

wherein said first type of memory device requires x address bits to access a given memory location in said first type of memory device;

wherein said second type of memory device requires y address bits to access a given memory location in said second type of memory device, wherein said y address bits is greater than said x address bits;

a memory configuration circuit for determining read or write configuration of said memory device;

wherein said memory configuration circuit is operable to serially transmit a read instruction and at least an x-bit address signal to a data input of the memory device, wherein said memory configuration circuit includes a sensing node configured to sense an output of the memory device in response to the first output transmitting the read instruction and the at least an x-bit address signal, wherein the sensing node is operable to detect presence of either the first type of memory device or the second type of memory device.

11. The system of claim 10, wherein said memory configuration circuit comprises:

a first input for receiving a start configuration signal;

a first output configured to serially transmit the read instruction and the at least an x-bit address signal to a data input of the memory device in response to the first input receiving the start configuration signal;

a sensing node configured to sense an output of the memory device in response to the first output transmitting the read instruction and the at least an x-bit address;

wherein said sensing node is discharged if memory device is of said first type, wherein said sensing node is not discharged if the memory device is of said second type.

12. The system as recited in claim 11, further comprising a configuration register coupled to said memory configuration circuit, for storing information indicating if memory device is of said first type or of said second type.

13. The system as recited in claim 12, wherein said memory configuration circuit further comprises:

a second output coupled to said configuration register, for setting the configuration register according to one of said first type of memory device output sensed at the sensing node and said second type of memory device output sensed at the sensing node.

14. The system as recited in claim 13 further comprising:

a precharge transistor coupled to said sensing node, wherein said precharge transistor is configured to precharge said sensing node to a first voltage level in response to said input node receiving said configuration signal;

an inverter having an input coupled to said sensing node, for generating an inversion of a voltage on said sensing node.

* * * * *